US009265186B2

(12) United States Patent
Nguyen

(10) Patent No.: US 9,265,186 B2
(45) Date of Patent: Feb. 16, 2016

(54) CAMERA SYSTEM FOR ALIGNING COMPONENTS OF A PCB

(71) Applicant: DELAWARE CAPITAL FORMATION, INC., Wilmington, DE (US)

(72) Inventor: Hoa Dinh Nguyen, Santa Ana, CA (US)

(73) Assignee: DELAWARE CAPITAL FORMATION, INC., Wilmington, DE (US)

( * ) Notice: Subject to any disclaimer, the term of this patent is extended or adjusted under 35 U.S.C. 154(b) by 674 days.

(21) Appl. No.: 13/655,016

(22) Filed: Oct. 18, 2012

(65) Prior Publication Data

US 2013/0120560 A1 May 16, 2013

Related U.S. Application Data

(60) Provisional application No. 61/558,347, filed on Nov. 10, 2011.

(51) Int. Cl.
H04N 7/18 (2006.01)
H05K 13/04 (2006.01)

(52) U.S. Cl.
CPC .................... *H05K 13/0413* (2013.01)

(58) Field of Classification Search
CPC ................................. H05K 13/0413
USPC ................ 348/126; 250/201.5; 257/E23.179
See application file for complete search history.

(56) References Cited

U.S. PATENT DOCUMENTS 4,608,494 A * 8/1986 Kobayashi ............ H01L 21/681
250/458.1
5,519,535 A 5/1996 Mok
(Continued)

FOREIGN PATENT DOCUMENTS

DE 198 57 263 A1 3/2000
DE 19857263 A1 * 3/2000 ............. B23Q 15/22
(Continued)

OTHER PUBLICATIONS

English Translation of Japanese Office action dated Sep. 10, 2013 issued in corresponding Japanese Application No. 2012-246173; 4pp. (see all pages).
(Continued)

Primary Examiner — Andy Rao
Assistant Examiner — Masum Billah
(74) Attorney, Agent, or Firm — Christie, Parker & Hale, LLP

(57) ABSTRACT

A camera system and associated method for aligning a component with a footprint on a PCB including: a housing having a first side and a second side opposite to the first side; a first image sensor positioned on the first side of the housing and pointing to a first direction away from the housing to capture an image of the component and generating a first image signal, wherein the first image sensor includes a first lens assembly without a prism; a second image sensor positioned on the second side of the housing and aligned with the first image sensor pointing to a second direction opposite to the first direction to capture an image of the footprint on the PCB and generating a second image signal, wherein the second image sensor includes a second lens assembly without a prism; a mixing circuit for mixing the first image signal with the second image signal and generating a mixed image signal; and a processor for processing the mixed image signal and displaying a superimposed image of the component and the footprint on a display monitor.

15 Claims, 6 Drawing Sheets

(56) References Cited

U.S. PATENT DOCUMENTS

| | | |
|---|---|---|
| 2005/0274869 A1 | 12/2005 | Yamauchi et al. |
| 2007/0257996 A1 | 11/2007 | Kurosawa et al. |
| 2008/0043123 A1 | 2/2008 | Shimomura et al. |

FOREIGN PATENT DOCUMENTS

| | | |
|---|---|---|
| EP | 0 301 255 A1 | 2/1989 |
| JP | 10-163253 | 6/1998 |
| JP | 2004-64334 A | 2/2004 |
| JP | 2004-309422 A | 11/2004 |
| JP | 2004-327495 | 11/2004 |
| JP | 2004327495 A * | 11/2004 |
| JP | 2007-295129 A | 11/2007 |
| JP | 2008-130771 | 6/2008 |

OTHER PUBLICATIONS

Decision of Final Rejection issued in corresponding Japanese Application No. 2012-246173, mailed Jan. 28, 2014, citing the above-identified references, including English translation, 5pp.

Communication with extended European Search Report for Application No. 12190872.7-1803 dated Mar. 14, 2013; search completed Mar. 6, 2013; 9 pages.

* cited by examiner

Pixels   1920x1080
Cam Out  960x540
DVI Out  1280x720

Pixels   1920x1080
Cam Out  1920x1080
DVI Out  1280x720

CAMERA SYSTEM FOR ALIGNING COMPONENTS OF A PCB

CROSS-REFERENCE TO RELATED APPLICATIONS

This Patent Application claims the benefit of the filing date of U.S. Provisional Patent Application Ser. No. 61/558,347, filed on Nov. 10, 2011 and entitled "Camera System For Aligning PCB Components," the entire content of which is hereby expressly incorporated by reference.

FIELD OF THE INVENTION

The present invention relates generally to automated alignment machines; and more particularly to a camera system for aligning components of a printed circuit board (PCB).

BACKGROUND

With the greater variety of components used on PCBs, smaller passive components and larger IC's with finer ball pitch dimensions, the demands on vision systems to aid PCB assembly (PCBA) rework have increased.

In electronic assembly industry, it is common to use one camera with an optical prism to view the PCB and component simultaneously. All these cameras use prism type optics. In ball grid array (BGA) rework applications, a large field of view (FOV), a high magnification and a high image quality is required during the alignment process, since the component footprints and their pitches are increasingly smaller. Traditionally, an expensive charge coupled device (CCD) camera is used with an expensive and bulky optical zoom lens and a split prism for viewing multiple surfaces at the same time. This increases the cost and complexity of such systems.

As a result, a high definition image, without the imperfections that result from the use of an external optical system, is now required to facilitate the placement of today's components.

SUMMARY

In some embodiments, the present invention is a camera system for aligning a component with a footprint on a printed circuit board (PCB). The camera system includes: a housing having a first side and a second side opposite to the first side: a first image sensor positioned on the first side of the housing and pointing to a first direction away from the housing to capture an image of the component and generating a first image signal, wherein the first image sensor includes a first lens assembly without a prism; a second image sensor positioned on the second side of the housing and aligned with the first image sensor pointing to a second direction opposite to the first direction to capture an image of the footprint on the PCB and generating a second image signal, wherein the second image sensor includes a second lens assembly without a prism; a mixing circuit for mixing the first image signal with the second image signal and generating a mixed image signal; and a processor for processing the mixed image signal and displaying a superimposed image of the component and the footprint on a display monitor.

The processor may be configured to detect when the superimposed image of the component and the footprint are aligned with a predetermined threshold, and generate a detection signal upon said detection, the detection signal being used to move the fixture away from the component and the PCB.

In some embodiments, the present invention is a camera system for aligning a component with a footprint on a PCB. The camera system includes: a fixture having a first side and a second side opposite to the first side; a first image capturing means positioned on the first side of the fixture and pointing to a first direction away from the fixture to capture an image of the component and generating a first image signal; a second image capturing means positioned on the second side of the fixture and aligned with the first image capturing means pointing to a second direction opposite to the first direction to capture an image of the footprint on the PCB and generating a second image signal; means for mixing the first image signal with the second image signal and generating a mixed image signal; and means for processing the mixed image signal and displaying a superimposed image of the component and the footprint on a display monitor.

In some embodiments, the present invention is a method for aligning a component with a footprint on a PCB. The method includes: providing a dual camera fixture including two image capturing sensors on opposite sides of the dual camera fixture; capturing an image of the component and generating a first image signal by a first image capturing sensor pointing to a first direction towards the component; capturing an image of the footprint on the PCB and generating a second image signal by a second image capturing sensor pointing to a second direction opposite to the first direction towards the PCB; mixing the first image signal with the second image signal and generating a mixed image signal; and processing the mixed image signal and displaying a superimposed image of the component and the footprint on a display monitor.

DETAILED DESCRIPTION

In some embodiments, the present invention is a dual camera system that automatically aligns a component to be inserted on a printed circuit board (PCB) to its footprints on the PCB. In some embodiments, two separate CMOS camera sensors are mounted on a fixture and their video signals are synchronized and output to a monitor to show a superimposition of the two images. The first image is an image of (a bottom of) a component to be aligned with a footprint on a PCB and to be inserted into such footprint. The second image is an image of (a top of) the PCB in the area of the component's footprint. Once the images are aligned, visually or automatically, the camera fixture is moved out of the way, and the component is lowered (and/or the PCB is elevated) so that the component precisely fits into its footprint on the PCB.

Figure 1:
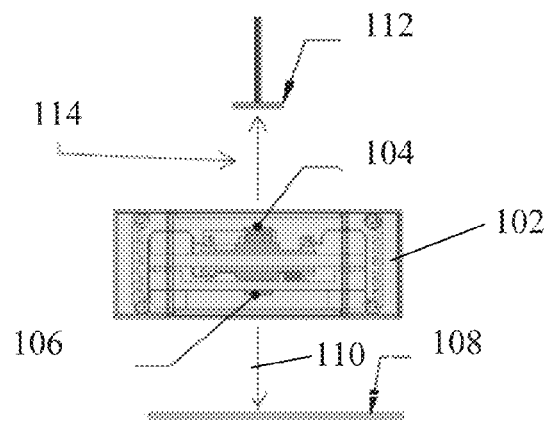
FIG. 1 is an exemplary simplified diagram of a dual camera system, according to some embodiments of the present invention.

FIG. 1 is an exemplary simplified diagram of a dual camera system, according to some embodiments of the present invention. As shown, a first (top) CCD sensor and its associated simplified lens 104 is mounted on top of a fixture/housing 102. Similarly, a second (bottom) CCD sensor and its associated simplified lens 106 is mounted on the fixture 102. In some embodiments, the first and second cameras are low cost CMOS CCD sensors with simplified optics, which do not include any (expensive and bulky) prisms.

The first sensor 104 is capable of pointing to (114) and capturing an image of (a bottom of) a component 112 to be inserted into a PCB 108. Similarly, the second sensor 106 is capable of pointing to (110) and capturing an image of (a top of) the PCB 110, especially the area at which the foot print of the component 112 is located on the PCB. The camera fixture 102, the component 112, and/or the PCB 108 can be moved relative to each other to align the component 112 with its footprint on the PCB, so that the component 112 can be flawlessly inserted into the footprint.

Figure 2:
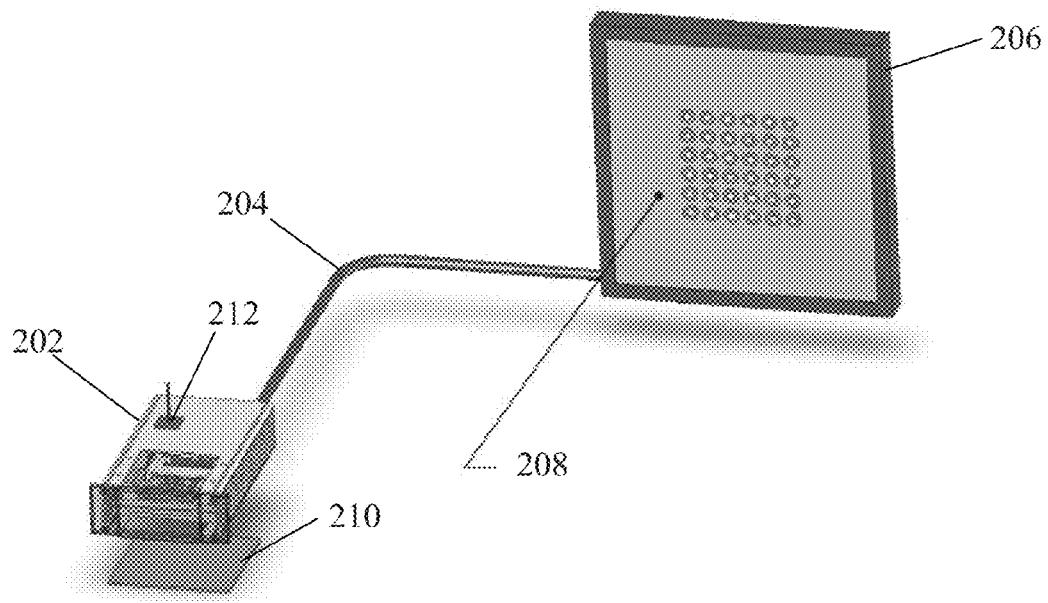
FIG. 2 shows an exemplary system diagram of a dual camera system, according to some embodiments of the present invention.

FIG. 2 shows an exemplary system diagram of a dual camera system, according to some embodiments of the present invention. Camera fixture 202 is electrically coupled to a display monitor 206. Those skilled in art would understand that the camera fixture may be physically connected to the monitor 206 by a cable 204, or be wirelessly connected to the monitor, in which case, there is no need for cable 204. As the component 212, camera fixture 202, and/or PCB 210 move, a processor processes and moves the synchronized images of the PCB and the component 208 within a display monitor 206. The component 212 is aligned with its footprint on the PCB 210, when the monitor shows the two images cover (aligned with) each other, within a certain threshold. A predetermined value for the threshold may depend on the pitch sizes of the component and its footprint on the PCB, the required accuracy, and/or the resolutions of the cameras.

Figure 3:
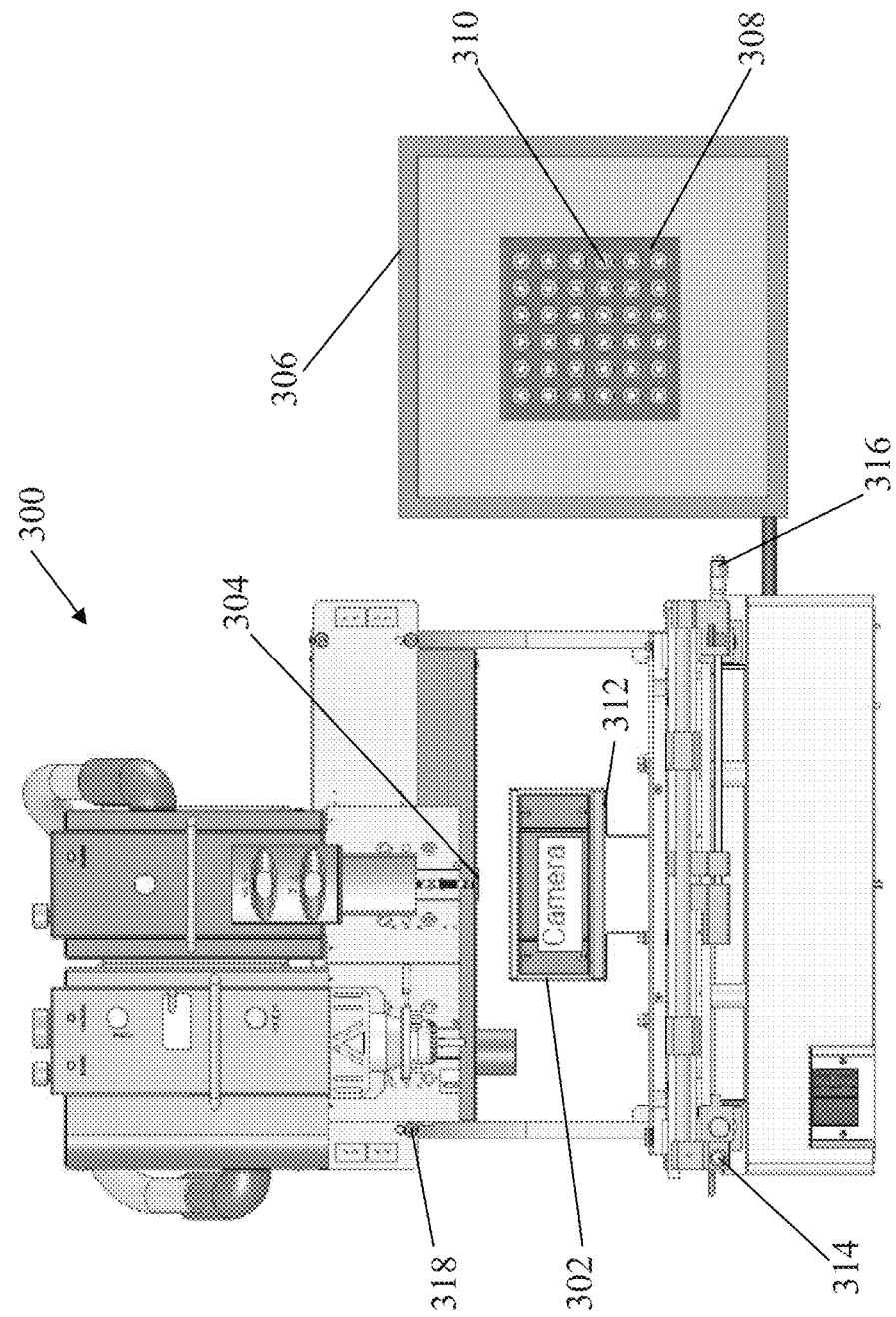
FIG. 3 shows an exemplary insertion (re-work) machine including a dual camera system, according to some embodiments of the present invention.

FIG. 3 shows an exemplary insertion (re-work) machine including a dual camera system, according to some embodiments of the present invention. As shown, the dual camera fixture 302 is used by the insertion machine 300 to align a component 304 with its footprint on a PCB 312. One or more of the component 304, camera fixture 302, and/or PCB 312 can move in three dimensions and relative to each other by, for example, micrometers 314, 316 and 318 of the insertion machine. Alternatively or in addition, the component 304, camera fixture 302, and/or PCB 312 may move by three or more corresponding servo motors that are controlled by a processor and a user interface, such as buttons, a joystick, and/or a keyboard.

Once the image of the appropriate portion of the PCB 308 is aligned with the image of the component 310 on the monitor 306, the camera fixture is moved out of the way of the component 304 and PCB 312, and the component is lowered and/or the PCB 312 is raised, so that the component can be inserted into its footprint. In some embodiments, a processor is configured to communicate with the insertion machine and cause the insertion machine to move the component and/or the PCB, until the processor detects when the superimposed image of the component and the footprint are aligned with a predetermined threshold.

In some embodiments, the detection of the alignment of the component 304 with its footprint on the PCB 312 is performed automatically by one or more processors executing a computer program. For example, the top and bottom sensor cameras may have predefined locations with respect to the insertion machine 300. These location are then aligned with targets located on top component and bottom PCB. Once the system is set up, the software controls the motorized board holder and/or component pick up to automatically align the predefined locations in top and bottom cameras. Once the predefined locations are aligned, the camera fixture automatically retracts to its home position. Then, the head holding the component moves down to its placement position and the vacuum force holding the component to the head is shut off to release component. The present invention is independent of and applicable to any type of rework machine. Accordingly, detail descriptions of the insertion (re-work machine may vary according to type and models of the re-work machine and thus are not provided herein.

In some embodiments, the processor may be part of a computer, for example, a personal computer (PC), a tablet computer, or a mobile device that controls the camera fixture. In some embodiments, the processor and associated hardware (e.g., memory, I/O interfaces, etc.) may be included in the camera fixture and the user is able to communicate with the processor via a user interface.

In some embodiments, the two cameras may be positioned (e.g., mounted) within a small housing (fixture), for example, about 3 inches wide, 5 inches long, and 2 inches tall. This small size is less than a quarter of the size of current camera/prism type systems, which are typically about 5.25 inches wide, 10 inches long, and 3.50 inches tall. Accordingly, the small size of the dual camera packaging allows for more mounting options in the re-work equipment.

Figure 4A:
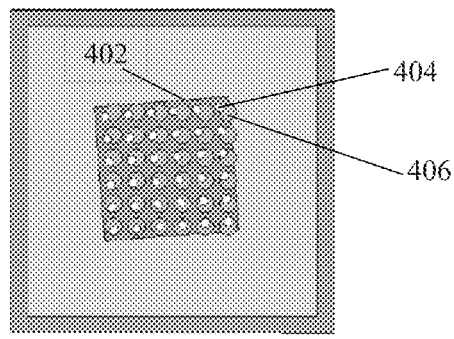
FIGS. 4A-4F show 3-dimensional alignment of a component with its footprint on a PCB.
Figure 4B:
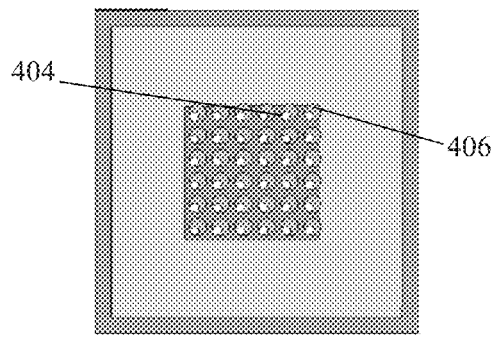
Figure 4C:
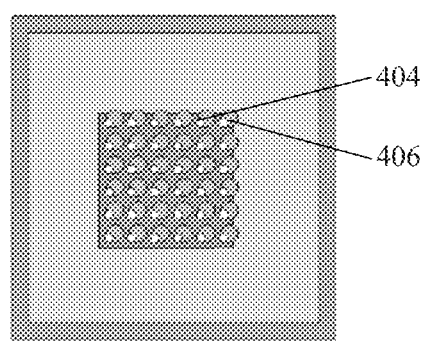
Figure 4D:
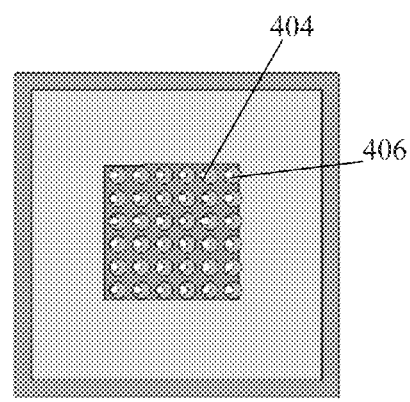
Figure 4E:
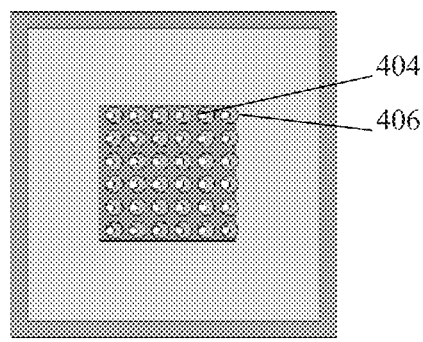
Figure 4F:
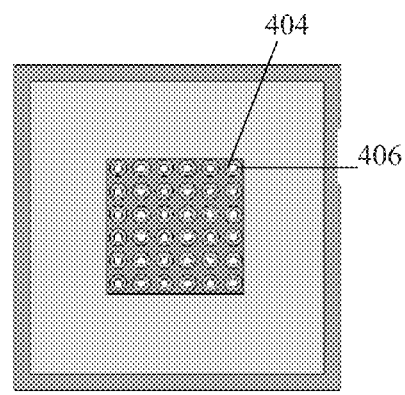

FIGS. 4A-4F show 3-dimensional alignment of a component with its footprint on a PCB. FIGS. 4A and 4B show annular alignment, FIGS. 4C and 4D show vertical (Y-axis) alignment, and FIGS. 4E and 4F show horizontal (X-axis) alignment. As shown in FIG. 4A, the image of pins or electrical pads 404 of the component 402 (captured by the first camera) are not aligned with the image of its footprint 406 on the PCB (captured by the second camera). That is, the component and/or the PCB need to be rotated manually and/or automatically to have the two images aligned with each other as illustrated in FIG. 4B. Similarly, in FIG. 4C, the image of pins or electrical pads 404 of the component 402 are not aligned with the image of its footprint 406 on the PCB. In this case, the component and/or the PCB need to be moved in the vertical (Y-axis) direction, manually and/or automatically, to have the two images aligned with each other as depicted in FIG. 4D. Likewise, in FIG. 4E, the image of pins or electrical pads 404 of the component 402 are not aligned with the image of its footprint 406 on the PCB. Here, the component and/or the PCB need to be moved in the horizontal (X-axis) direction, manually and/or automatically, to have the two images aligned with each other as depicted in FIG. 4F. In practice, a combination of annular, vertical and/or horizontal alignment may need to be performed to align the two images.

In some embodiments, the alignment of the two images is automatically detected by a computer program. For example, multiple reference points may be pre-selected on both the component and the footprint on the PCB and once these reference points align with each other mapped in a computer memory, the system automatically detects that the two images and thus the component and its footprint on the PCB are aligned.

In some embodiments, upon detection of the alignment of the two images, the system moves the camera fixture out of the way of the component and the PCB, and inserts the component into its footprint on the PCB.

Figure 5:
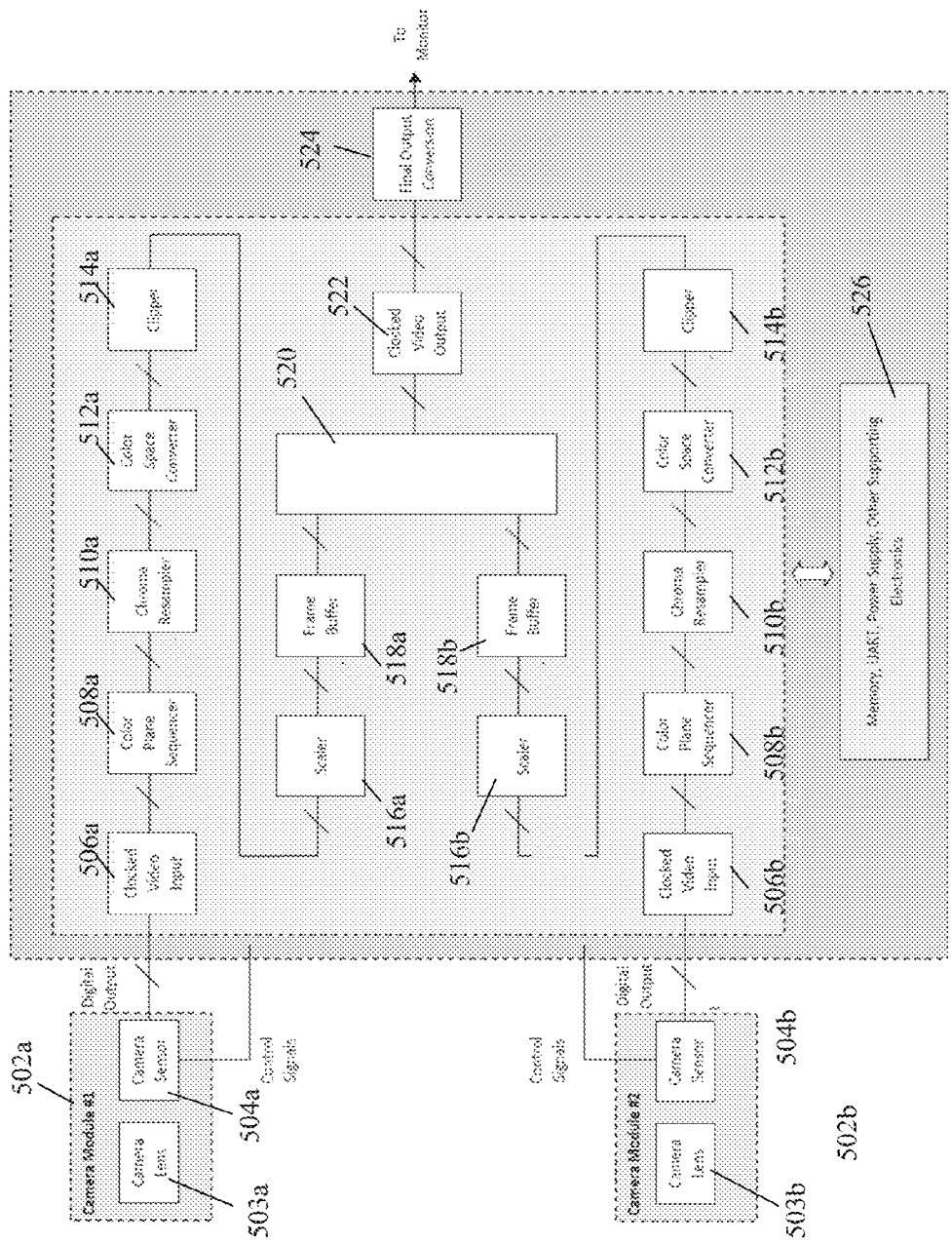
FIG. 5 is an exemplary block diagram for image processing and synchronization of a dual camera system, according to some embodiments of the present invention.

FIG. 5 is an exemplary block diagram for image processing and synchronization of a dual camera system, according to some embodiments of the present invention. As shown, a first camera module 502a includes a simple camera lens 503a and a camera sensor 504a. Similarly, a second camera module 502b includes a simple camera lens 503b and a camera sensor 504b. In some embodiments, the camera sensors 504a and 504b are high definition (HD) CMOS sensors. In some embodiments, the camera lenses 503a and 503b have simplified optics with no prism to reduce distortion and cost. In these embodiments, there is no need for split camera or wide angle optics to view corners of large packages or increase field of view to be able to view the entire component during the alignment. The digital output of each camera module is synchronized with a system clock in blocks 506a and 506b and input to respective color plane sequencers (508a and 508b) to process the color of the images. The video signals then go through respective chroma resampler (510a, b), color space converters (512a, b), clippers (514a, b), scalers (516a, b), and respective frame buffers (518a, b) to perform further image processing, as known in the art.

The output of the frame buffer 518a, which includes the image from the first camera module 502a is them synchronized (or mixed) by a mixer 520 with the output of the frame buffer 518b, which includes the image from the second camera module 502b. The output of the mixer 520 is then clocked (block 522) and converted to a desired video format by a video converter 524 and output to, for example, a monitor for display. The supporting electronics including a cpu, memory, UART, power supply and the like are shown by block 526. The level of mixing the images from the cameras can be adjusted to increase resolution, resulting in a clearer image. Furthermore, each of the cameras may be independently operated (without mixing the images) for inspection, alignment, and other functions, as needed.

The above image processing and synchronization of the dual camera system include various functions such as storing default and user-defined parameters for the image processing, such as Alpha level settings, color and chroma adjustments, scaling and mixing, and other known image processing techniques. In some embodiments, these function may be selected and activated by pressing specialized buttons of the camera fixture. In some embodiments, these function may be selected and activated by a graphical user interface (GUI).

Although, two cameras are used as examples of the multi-camera system, more than two cameras can easily be accommodated by the present invention. For example, the mixer 520 may have external input jacks to accommodate (processed) images of more cameras. In some embodiments, two cameras at a short distance from each other may be used to generate a stereo (or 3-D) image of the components, and two other cameras (at a short distance from each other) may be used to generate a stereo (or 3-D) image of the PCB. The above described electronic circuits are then modified accordingly.

Figure 6:
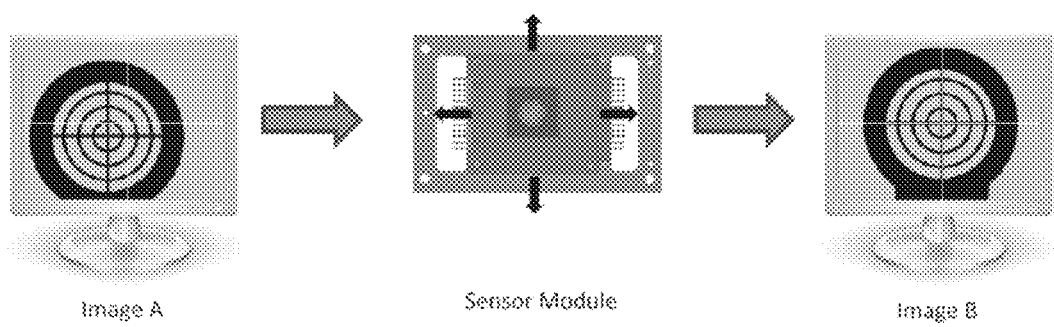
FIG. 6 schematically depicts calibration of the camera modules, according to some embodiments of the present invention.

FIG. 6 schematically depicts calibration of the camera modules, according to some embodiments of the present invention. In some embodiments, to calibrate the camera system of the present invention in production, the camera modules are set to a close focal distance, for example, a couple of inches (e.g., 2.8") from the sensors to a target (a component under view) and aligned for a common optical path. The focuses of the two camera is then adjusted to two targets opposite to each other and located at the local distance. In some embodiments, the two cameras are positioned on a straight plate on the opposite sides of the plate. The positions of both cameras are adjustable with respect to the plate in three dimensions, by some adjusting pins. The plate with the two cameras is then fixed to a calibration railing pair in an orientation perpendicular to the rails. A first target is fixed to the rails and perpendicular to the rails, within the close local distance of the first camera. Similarly, a second target is fixed to the rails on the opposite side to the first target and perpendicular to the rails, within the close local distance of the second camera. The two cameras are then connected to a display monitor depicting the images of both targets.

Subsequently, the cross hair feature of both sensor is enabled, resulting in two on-screen images of the first camera cross hair and the second camera cross hair displayed on the monitor. In FIG. 6, Image A represents the initial location of the first (or second) sensor's image and its cross hair. Here, for simplicity, only the image on one cross hair and one target are shown. Then, the first camera's (sensor's) position is adjusted with respect to the plate (shown in the middle of FIG. 6), so that the depicted image of the cross hair is aligned with the center of the first target, as shown in Image B of FIG. 6. Same process is repeated with respect to the second camera (sensor) on the opposite side of the plate to align the depicted image of the second camera cross hair with the center of the second target, as shown in Image B. Image B represents a sensor that has been aligned along a predetermined path, by being aligned with the on-screen crosshairs. That is, when completed, the images from both cameras show two target reticles that have been centered and aligned with the two on-screen cross hairs and define a common optical path for the two cameras. The calibration fixture, the rails and the plate are fixed and do not move with respect to each other, during the entire calibration process.

When the calibration process is completed, the centers of the first target, the second target, the first camera cross hair and the second camera cross hair are all aligned, similar to Image B. This way, it is ensured that the two cameras have a same (common) optical paths and are aligned with respect to each other on the plate. The plate is then assembled in a camera fixture. Once the camera fixture is calibrated, no further calibration is needed at the user site.

In some embodiments, the present invention has the ability to automatically adjust the image resolution and the video output accordingly on the fly (dynamically) to maximize FOV and magnification while maintaining high image quality. Accordingly, a set of simple CMOS sensors with fixed lens positioned back to back or opposed to each other may be used for viewing multiple surfaces and the video output is manipulated by the firmware (and/or software) to allow for the highest image quality needed.

In some embodiments, the present invention has the capability to perform digital zoom optimization. In general, as objects are digitally zoomed into focus, they can become blurry due to cropping and stretching of the image by digital zooming function, which reduces the resolution. However, the invention progressively changes the resolution according with the level of zooming and thus generates blur free images, as the digital zoom increases.

Figure 7A:
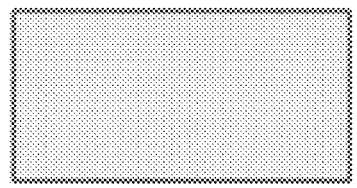
FIGS. 7A-7B are exemplary process flow diagrams for calibration of the camera modules, according to some embodiments of the present invention.
Figure 7B:
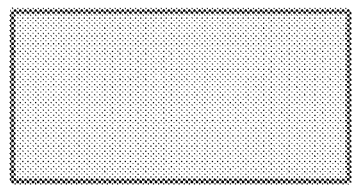

FIGS. 7A and 7B schematically depicts digital zooming technique of the camera modules, according to some embodiments of the present invention. A shown in FIG. 7A, the resolution setting is 1920×1080, the camera resolution is set to 960×540 and the output (e.g., DVI) resolution is 1280×720. During a digital zoom, this low resolution image is cropped and magnified, resulting in a low resolution and possibly blurred images. In FIG. 7B, the resolution setting is fixed at 1920×1080, and the output resolution is 1280×720. However, as the imaged is digitally zoomed, its resolution is increased incrementally to 1920×1080, in this case. This results in a higher resolution for the cropped portion at the fixed DVI (output) resolution of 1280×720. The camera out resolution may be incrementally increased as the digital zoom is increased up to the resolution of the sensors, that is, 1920×1080, in this example. As one with ordinary skills in the art would understand, the resolution of the cameras are changed by image processing techniques in the, for example, block diagram of FIG. 5.

It will be recognized by those skilled in the art that various modifications may be made to the illustrated and other embodiments of the invention described above, without departing from the broad inventive step thereof. It will be understood therefore that the invention is not limited to the particular embodiments or arrangements disclosed, but is rather intended to cover any changes, adaptations or modifications which are within the scope and spirit of the invention as defined by the appended claims.

What is claimed is:

1. A camera system for aligning a component with a footprint on a printed circuit board (PCB) comprising:
    a housing having a first side and a second side opposite to the first side;
    a first image sensor positioned on the first side of the housing and pointing to a first direction away from the housing to capture an image of the component and generate a first image signal, wherein the first image sensor includes a first lens assembly without a prism;
    a second image sensor positioned on the second side of the housing and aligned with the first image sensor pointing to a second direction opposite to the first direction to capture an image of the footprint on the PCB and generate a second image signal, wherein the second image sensor includes a second lens assembly without a prism;
    a mixing circuit for mixing the first image signal with the second image signal and generating a mixed image signal; and
    a processor for processing the mixed image signal and displaying a superimposed image of the component and the footprint on a display monitor, wherein
    the processor automatically detects when the superimposed image of the component and the footprint on the PCB are aligned using multiple reference points preselected on both the component and the footprint; controls the camera system to align said pre-selected reference points with each other, using a predetermined threshold; generates a detection signal upon said detection, and moves the housing away from the component and the PCB after said detection.

2. The camera system of claim 1, wherein the value for the predetermined threshold depends on one or more of pitch sizes of the component and the footprint on the PCB, a required accuracy, and resolutions of the image sensors.

3. The camera system of claim 1, wherein the camera system is integrated with an insertion machine, and the processor communicates with the insertion machine.

4. The camera system of claim 3, wherein the processor causes the insertion machine to move one or more of the component and the PCB, until the processor detects when the superimposed image of the component and the footprint are aligned with the predetermined threshold.

5. The camera system of claim 4, wherein the processor further causes the insertion machine to move the housing away from the component and the PCB and lower the component onto the footprint on the PCB for insertion.

6. The camera system of claim 1, wherein the processor dynamically adjusts the image resolution and the video output to maximize field of view and magnification of the image sensors.

7. The camera system of claim 1, wherein the first image sensor and the second image sensor are cameras, and further comprising:
    a third camera positioned on the first side of the housing at a first angle to the first camera to capture a second image of the component and generate a third image signal;
    a fourth camera positioned on the second side of the housing at a second angle to the second camera to capture a second image of the footprint on the PCB and generate a fourth image signal; and
    a second mixing circuit for mixing the first image signal with the third image signal to generate a first 3D image signal and for mixing the second image signal with the fourth image signal to generate a second 3D image signal, wherein the processor displays a superimposed 3D image of the component and 3D image of the footprint on the display monitor.

8. The camera system of claim 1, wherein the processor progressively changes a resolution of the first image sensor or the second image sensor according with a level of a corresponding image sensor digital zooming and generates blur free images, as the digital zoom increases.

9. A camera system for aligning a component with a footprint on a printed circuit board (PCB) comprising:
    a fixture having a first side and a second side opposite to the first side;
    a first image capturing means positioned on the first side of the fixture and pointing to a first direction away from the fixture to capture an image of the component and generate a first image signal;
    a second image capturing means positioned on the second side of the fixture and aligned with the first image capturing means pointing to a second direction opposite to the first direction to capture an image of the footprint on the PCB and generate a second image signal;
    means for mixing the first image signal with the second image signal and generating a mixed image signal;
    means for processing the mixed image signal and displaying a superimposed image of the component and the footprint on a display monitor
    means for detecting when the superimposed image of the component and the footprint are aligned with a predetermined threshold;
    means for generating a detection signal upon said detection; and
    means for moving the fixture away from the component and the PCB after said detection.

10. The camera system of claim 9, wherein the value for the predetermined threshold depends on one or more of pitch sizes of the component and the footprint on the PCB, a required accuracy, and resolutions of the image sensors.

11. The camera system of claim 9, wherein the camera system is integrated with an insertion machine, and further includes means for communicating with the insertion machine.

12. The camera system of claim 11, further comprising means for causing the insertion machine to move one or more of the component and the PCB, until said detection of when the superimposed image of the component and the footprint are aligned with the predetermined threshold occurs.

13. The camera system of claim 12, further comprising means for causing the insertion machine to move the fixture away from the component and the PCB and lower the component onto the footprint on the PCB for insertion.

14. The camera system of claim 9, further comprising means for dynamically adjusting the image resolution and the video output to maximize field of view and magnification of the image sensors.

15. A method for aligning a component with a footprint on a printed circuit board (PCB) comprising:
- providing a dual camera fixture including two image capturing sensors on opposite sides of the dual camera fixture;
- capturing an image of the component and generating a first image signal by a first image capturing sensor pointing to a first direction towards the component;
- capturing an image of the footprint on the PCB and generating a second image signal by a second image capturing sensor pointing to a second direction opposite to the first direction towards the PCB;
- mixing the first image signal with the second image signal and generating a mixed image signal;
- processing the mixed image signal and displaying a superimposed image of the component and the footprint on a display monitor;
- automatically detecting when the superimposed image of the component and the footprint on the PCB are aligned using multiple reference points pre-selected on both the component and the footprint;
- controlling the dual camera fixture to align said pre-selected reference points with each other, using a predetermined threshold;
- generating a detection signal upon said detection; and
- moving the dual camera fixture away from the component and the PCB after said detection.

* * * * *